United States Patent
Lim et al.

(12)

(10) Patent No.: US 11,049,456 B2
(45) Date of Patent: Jun. 29, 2021

(54) LIGHT EMITTING DISPLAY APPARATUS

(71) Applicant: LG Display Co., Ltd., Seoul (KR)

(72) Inventors: SangHyun Lim, Paju-si (KR); Kiyoung Sung, Paju-si (KR); SeHwan Na, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/726,896

(22) Filed: Dec. 25, 2019

(65) Prior Publication Data

US 2020/0211470 A1 Jul. 2, 2020

(30) Foreign Application Priority Data

Dec. 31, 2018 (KR) ........................ 10-2018-0173505

(51) Int. Cl.
| | |
|---|---|
| *G06F 3/041* | (2006.01) |
| *G09G 3/3266* | (2016.01) |
| *H01L 27/32* | (2006.01) |
| *H01L 51/52* | (2006.01) |
| *G09G 3/3258* | (2016.01) |
| *H01L 51/00* | (2006.01) |

(52) U.S. Cl.
CPC ......... *G09G 3/3266* (2013.01); *G06F 3/0416* (2013.01); *G09G 3/3258* (2013.01); *H01L 27/3276* (2013.01); *H01L 51/0097* (2013.01); *H01L 51/5253* (2013.01); *G09G 2380/02* (2013.01)

(58) Field of Classification Search
CPC .. G09G 3/3275; G09G 3/3266; G09G 3/3258; G09G 2380/02; H01L 27/3276; H01L 51/0097; H01L 51/5253; G06F 3/0416
See application file for complete search history.

(56) References Cited

U.S. PATENT DOCUMENTS

2017/0316738 A1\* 11/2017 Sohn .................... G09G 3/3275

\* cited by examiner

*Primary Examiner* — Abdul-Samad A Adediran
(74) *Attorney, Agent, or Firm* — Polsinelli PC

(57) ABSTRACT

A light emitting display apparatus comprises a light emitting display panel including a display area displaying an image and a non-display area surrounding the display area; a first non-display area of the non-display area including a pad area provided with pads electrically connected with a circuit board, a boundary area adjacent to the display area, and a bending area provided between the pad area and the boundary area, a power line pad and a first sensing line pad provided in the pad area; wherein the power line pad supplies a power source to the pixels and is connected with a power line provided in the pad area, the bending area and the boundary area, and wherein the first sensing line pad is connected with a first sensing line provided in the pad area, the bending area and the boundary area, and the first sensing line is connected with the power line in the boundary area.

20 Claims, 5 Drawing Sheets

LIGHT EMITTING DISPLAY APPARATUS

CROSS REFERENCE TO RELATED APPLICATION

This application claims priority from Korean Patent Application No. 10-2018-0173505, filed on Dec. 31, 2018, which is hereby incorporated by reference in its entirety.

BACKGROUND

Field of the Disclosure

The present disclosure relates to a light emitting display apparatus using a light emitting display panel in which a non-display area is bent.

Description of the Background

A light emitting display apparatus using a light emitting diode such as an organic light emitting diode may be manufactured using a flexible substrate.

Based on an area where the flexible substrate is bent, that is, a bending area, a display area where an image is displayed is provided at one side of the flexible substrate and pads connected with a circuit board are provided at the other side of the flexible substrate. The display area is provided with pixels.

Power pads, to which power lines for supplying a power source to the pixels are connected, are included in the pads.

In this case, the power source supplied from the circuit board is supplied to the power line through the power pad, wherein the power line is connected to the pixels provided in the display area through the bending area.

Since the power line is bent in the bending area together with the flexible substrate, a size of the power source supplied form the circuit board may be different from a size of a power source actually supplied to the pixels.

If the size of the power source supplied from the circuit board becomes different from the size of a power source actually supplied to the pixels, the pixels may not be driven normally, whereby a color of an image output from the display apparatus may be changed.

Also, if the size of the voltage supplied to the pixel to compensate for or sense degradation of a driving transistor provided in the pixel is changed due to the aforementioned cause, degradation of the driving transistor may not be compensated normally.

SUMMARY

The present disclosure has been made in view of the above problems, and the present disclosure provides a light emitting display apparatus that can change a size of a power source supplied to a power line, which is provided in a boundary area between a bending area and a display area, by using resistance characteristic of the power line.

In accordance with an aspect of the present disclosure, the above and other aspects can be accomplished by the provision of a light emitting display apparatus comprising a light emitting display panel categorized into a display area provided with pixels, displaying an image, and a non-display area surrounding the display area. A first non-display area of the non-display area includes a pad area provided with pads electrically connected with a circuit board, a boundary area adjacent to the display area, and a bending area provided between the pad area and the boundary area. The pad area is provided with a power line pad and a first sensing line pad. The power line pad supplies a power source to the pixels, and is connected with a power line provided in the pad area, the bending area and the boundary area. The first sensing line pad is connected with a first sensing line provided in the pad area, the bending area and the boundary area. The first sensing line is connected with the power line in the boundary area.

In accordance with another aspect of the present disclosure, the above and other objects can be accomplished by the provision of a light emitting display apparatus comprising a light emitting display panel categorized into a display area provided with pixels, displaying an image, and a non-display area surrounding the display area, and a controller for controlling signals to data lines and gate lines provided in the light emitting display panel. The non-display area includes a pad area provided with pads, a boundary area adjacent to the display area and a bending area provided between the pad area and the boundary area. The pad area is provided with a power line pad and a first sensing line pad. The power line pad supplies a power source to the pixels, and is connected with a power line provided in the pad area, the bending area and the boundary area. The first sensing line pad is connected with a first sensing line provided in the pad area, the bending area and the boundary area. The first sensing line is connected with the power line in the boundary area. The controller is electrically connected with the first sensing line pad.

According to the present disclosure, a size of the power source supplied to the power line, which is provided in the boundary area between the bending area and the display area, can be changed by using resistance characteristic of the power line.

Therefore, a normal power source may be supplied to the pixels provided in the display area, whereby a color of an image output from the display apparatus may not be changed, and degradation of a driving transistor can normally be compensated.

In addition to the effects of the present disclosure as mentioned above, additional advantages and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
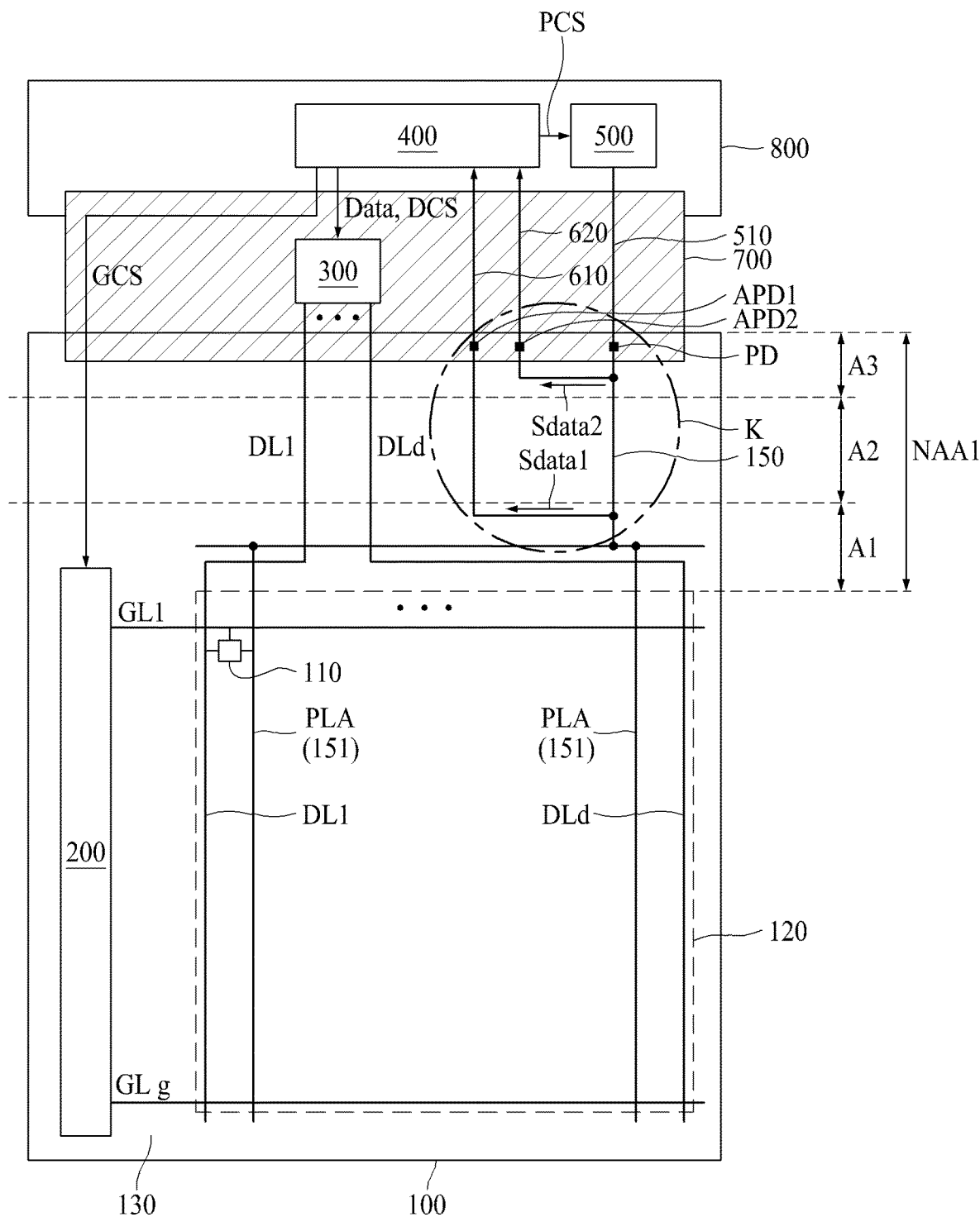
FIG. 1 is an exemplary view illustrating elements of a light emitting display apparatus according to the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

In this specification, in adding reference numbers to elements of respective drawings, it is to be noted that the same reference elements have the same reference numbers if possible even though the same reference elements are shown on different drawings.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It should be understood that the term "at least one" includes all combinations related with one or more items. For example, "at least one among a first item, a second item and a third item" may include all combinations of two or more items selected from the first, second and third items as well as each item of the first, second and third items.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the present disclosure will be described with reference to the accompanying drawings and examples.

Figure 2:
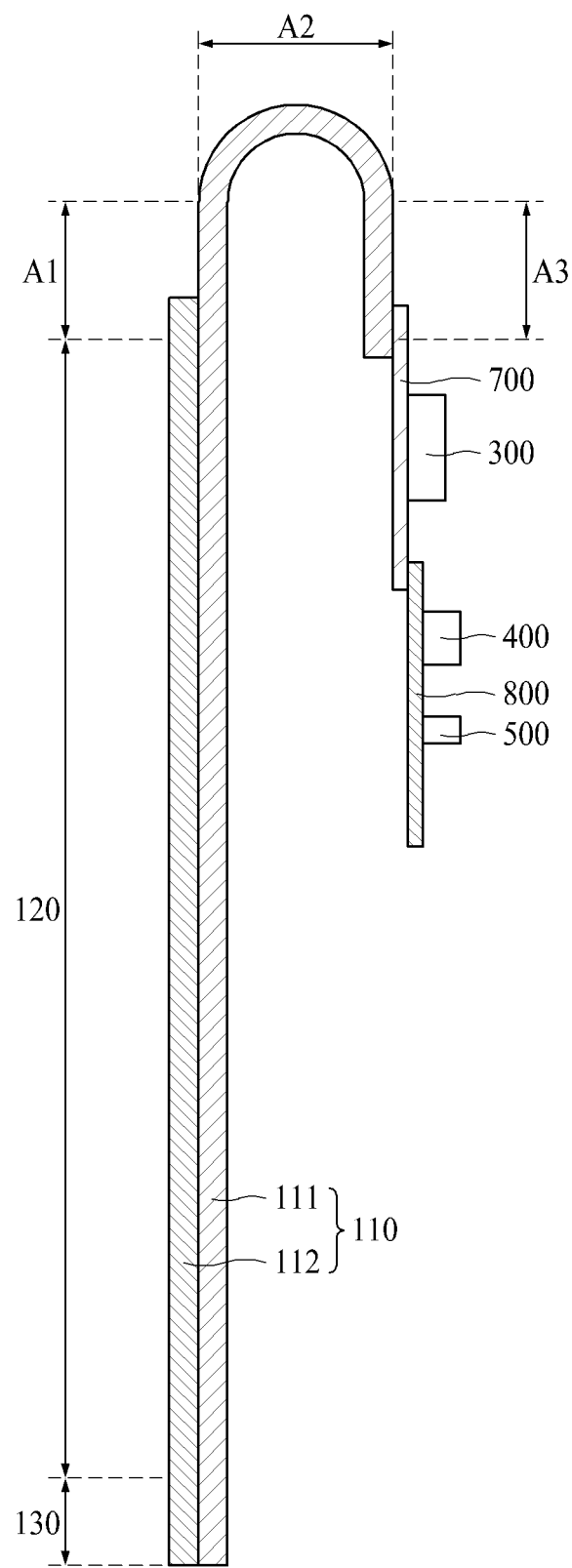
FIG. 2 is an exemplary view illustrating external elements of a light emitting display apparatus according to the present disclosure.
Figure 3:
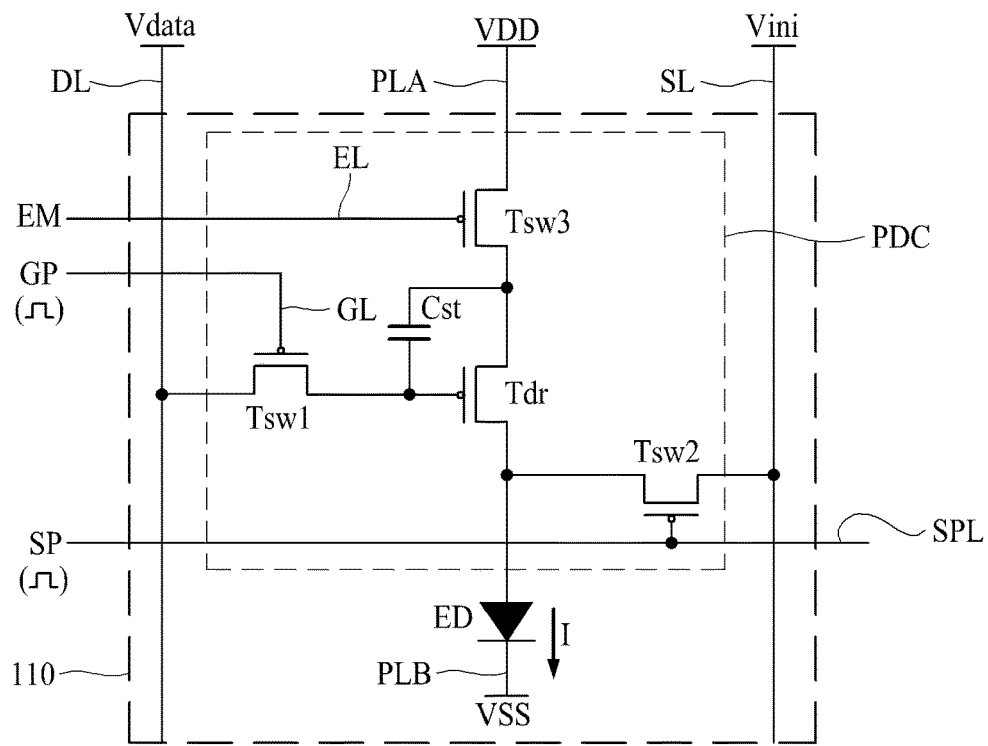
FIG. 3 is an exemplary view illustrating elements of a pixel applied to a light emitting display apparatus according to the present disclosure.
Figure 4:
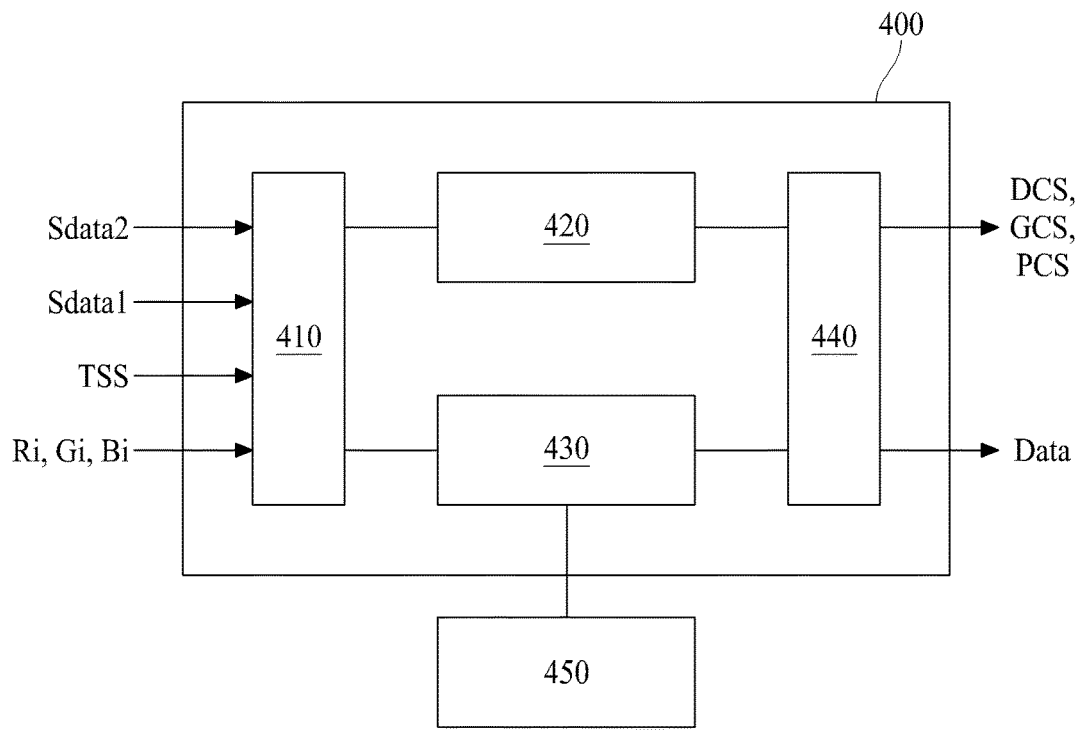
FIG. 4 is an exemplary view illustrating elements of a controller applied to a light emitting display apparatus according to the present disclosure.

FIG. 1 is an exemplary view illustrating elements of a light emitting display apparatus according to the present disclosure, FIG. 2 is an exemplary view illustrating external elements of a light emitting display apparatus according to the present disclosure, FIG. 3 is an exemplary view illustrating elements of a pixel applied to a light emitting display apparatus according to the present disclosure, and FIG. 4 is an exemplary view illustrating elements of a controller applied to a light emitting display apparatus according to the present disclosure.

As shown in FIGS. 1 to 4, the light emitting display apparatus according to the present disclosure comprises a light emitting display panel 100 categorized into a display area 120 provided with pixels 110, displaying an image, and a non-display area 130 surrounding the display area 120, and fabricated of a flexible substrate 111, a gate driver 200 for supplying gate signals to gate lines GL1 to GLg provided in the light emitting display panel 100, a data driver 300 for supplying data voltages Vdata to data lines DL1 to DLd provided in the light emitting display panel 100, a power supply unit 500 for supplying a power source required for the gate driver 200 and the data driver 300, and a controller 400 for controlling functions of the gate driver 200, the data driver 300 and the power supply unit 500. Hereinafter, the present disclosure will be described based on that the power source is a voltage as an example. However, the present disclosure, which will be described later, may be applied to even the case that the power source is a current.

Hereinafter, the above elements will be described in due order.

First of all, the light emitting display panel 100, as shown in FIG. 3, is provided with pixels 110 including the light emitting diode ED and a pixel driving circuit PDC. Also, on the light emitting display panel 100, signal lines for defining a pixel area provided with the pixels 110 and supplying driving signals to the pixel driving circuit PDC are formed.

The light emitting diode ED includes a first electrode, a light emitting layer provided on the first electrode, and a second electrode provided on the light emitting layer. The light emitting layer may include any one of a blue light emitting portion, a green light emitting portion and a red light emitting portion, which are intended to emit light of a color corresponding to a color set in the pixel 110. The light emitting layer may include any one of an organic light emitting layer, an inorganic light emitting layer and a quantum dot light emitting layer, or may include a deposited or mixed structure of the organic light emitting layer (or the inorganic light emitting layer) and the quantum dot light emitting layer.

The signal lines may include gate lines GL, initialization signal lines SPL, data lines DL, an initialization line SL, first driving voltage lines PLA, second driving voltage lines PLB, and emission lines EL.

The gate lines GL are formed in parallel to have a certain interval along a second direction of the light emitting display panel 100, for example, a horizontal direction.

The initialization signal lines SPL may be formed at a certain interval to be parallel with the gate lines GL. An initialization on signal SP is supplied to the initialization signal lines SPL.

The data lines DL may be formed in parallel to have a certain interval along a first direction of the light emitting display panel 100, for example, a vertical direction, thereby crossing the gate lines GL and the initialization signal lines SPL. However, an arrangement structure of the data lines DL and the gate lines GL may be changed in various ways.

The initialization line SL may be formed at a certain interval to be parallel with the data lines DL. An initialization voltage Vinit or a voltage for sensing a threshold voltage (or mobility) may be supplied to the initialization line SL. The initialization voltage Vinit may serve to initialize a gate of a driving transistor Tdr or the light emitting diode, or may be used for the above sensing.

The first driving voltage lines PLA may be formed at a certain interval to be parallel with the data lines DL and the initialization lines SL. The first driving voltage line PLA is connected to the power supply unit 500 and thus supplies a first driving voltage VDD, which is supplied from the power supply unit 500, to each pixel 110.

The second driving voltage lines PLB supply a second driving voltage VSS, which is supplied from the power supply unit 500, to each pixel 110.

The pixel driving circuit PDC may include a driving transistor Tdr for controlling a size of a current I flowing to the light emitting diode ED, a switching transistor Tsw1 connected among the data line DL, the driving transistor Tdr and the gate line GL, an initialization transistor Tsw2 for transmitting the initialization voltage Vinit to the driving transistor Tdr, an emission transistor Tsw3 for controlling a light emitting timing of the light emitting diode ED, and a capacitor Cst.

Also, the pixel driving circuit PDC provided in each of the pixels 110 may further be provided with transistors and capacitors for internal compensation or external compensation.

That is, the pixel driving circuit PDC may be changed in various structures to perform internal compensation or external compensation, and a method for driving the pixel driving circuit PDC may also be changed in various ways.

Since the present disclosure is not characterized in the structure and function of the pixel driving circuit PDC, a detailed description of a detailed structure and function of the pixel driving circuit PDC will be omitted.

In the present disclosure, each of the first driving voltage line PLA, the second driving voltage line PLB and the initialization line SL may be a line diverged from a power line 150 which will be described later.

The power line 150 is connected with the power supply unit 500. The power supply unit 500 is provided in the circuit board, especially provided in a main board 800 in the light emitting display apparatus shown in FIG. 1.

The main board 800 may be provided with the controller 400 and the power supply unit 500, and is electrically connected with a film 700 provided with the data driver 300. The film 700 is electrically connected with the light emitting display panel 100 through the pads provided in the light emitting display panel 100.

The light emitting display panel 100, as shown in FIGS. 1 and 2, is categorized into the display area 120 provided with the pixels, where an image is displayed, and the non-display area 130 surrounding the display area 120, and is fabricated of the flexible substrate 111.

That is, the light emitting display panel 100 includes the flexible substrate 111 provided with the pixel driving circuit PDC, the light emitting diode ED and the signal lines, and an encapsulation substrate 112 for sealing the flexible substrate.

In this case, a first non-display area NAA1 of the non-display area 130, as shown in FIGS. 1 and 2, includes a pad area A3 provided with pads electrically connected with the circuit board, a boundary area A1 adjacent to the display area 120, and a bending area A2 provided and bent between the pad area A3 and the boundary area A1.

The flexible substrate 111 may be bent by the bending area A1 as shown in FIG. 2. That is, the bending area A2 may be bent toward a rear surface of the light emitting display panel 100.

The circuit board may be the main board 800, or may be the film 700. That is, the controller 400 and the power supply unit 500 provided in the main board 800 and the data driver 300 provided in the film 700 may electrically be connected to the light emitting display panel 100 through the pads provided in the pad area A3.

Therefore, in the following description, the circuit board refers to the main board 800 and the film 700.

The pad area A3 is provided with a power line pad PD to which the power line 150 for supplying a power source to the pixels 110 is connected, and a first sensing line pad APD1 to which a first sensing line 610 connected with the power line 150 in the boundary area A1 is connected.

The power line 150 may be a line for supplying the first driving voltage VDD, a line for supplying the second driving voltage VSS, or a line for supplying the initialization voltage Vinit. In addition these voltages, the power line 150 may be a line for supplying another voltage to be supplied to the light emitting display panel.

The display area 120 is provided with display area power lines 151 diverged from the power line 150 along the data lines DL1 to DLd, which are provided in the light emitting display panel 100, in the boundary area A1, and the display area power lines 151 are connected to the pixel driving circuit PDC provided in the pixel 110. In FIG. 1, the power line 150 is shown as a line for supplying the first driving voltage VDD. In this case, the display area power line 151 becomes the first driving voltage line PLA.

However, as described above, if the power line 150 is a line for supplying the second driving voltage VSS, the display area power line 151 becomes the second driving voltage line PLB, and if the power line 150 is a line for supplying the initialization voltage Vinit, the display area power line 151 becomes the initialization line SL.

That is, although the power line 150 to which the first driving voltage is supplied is only shown in FIG. 1, a power line to which the second driving voltage VSS is supplied, a power line to which the initialization voltage Vinit is supplied, and a power line to which another power source is supplied may further be provided in the light emitting display panel 100.

In this case, the pad area A3 is provided with another power line pads PD connected to each of the power lines, another first sensing lines are connected to each of the power lines, and each of them is connected to another first sensing line pad.

In this case, any one of the first sensing line pads may be provided between the power line pads. That is, any one of the first sensing line pads may be provided between two power lines adjacent to each other, and may be connected to any one of the two power lines.

Hereinafter, a detailed structure of the power line 150 and the display area power line 151 will be described with reference to FIG. 5.

Secondly, the gate driver 200 supplies a gate on signal GP to the gate lines GL1 to GLg provided in the light emitting display panel 100 by using the gate control signals GCS transmitted from the controller 400.

In this case, the gate on signal GP means a signal that can turn on the switching transistor Tsw1 connected to the gate lines GL1 to GLg. A signal that can turn off the switching transistor Tsw1 is referred to as a gate off signal. The gate on signal GP and the gate off signal are commonly referred to as a gate signal.

The gate driver 200 may supply an emission signal EM to the emission lines EL provided in the light emitting display panel 100 by using the gate control signals GCS transmitted from the controller 400.

In this case, the emission signal EM may also include an emission on signal which can turn on the emission transistor Tsw3 and an emission off signal which can turn off the emission transistor Tsw3.

Also, the gate driver 200 may supply an initialization signal that can turn on or turn off the initialization transistor Tsw2.

In this case, the initialization signal may also include an initialization on signal SP which can turn on the initialization transistor Tsw2 and an initialization off signal which can turn off the initialization transistor Tsw2.

The gate driver 200 may be formed independently from the organic light emitting display panel 100 and thus connected to the organic light emitting display panel 100 through a tape carrier package (TCP), a film (COF), or a flexible printed circuit board (FPCB).

The gate driver 200 may directly be formed in the non-display area 130 of the organic light emitting display panel 100 through a manufacturing process of the pixel driving circuits PDC by using a gate in panel (GIP).

Thirdly, the data driver 300 modifies image data transmitted from the controller 400 to data voltages Vdata and then supplies the data voltages Vdata to the data lines DL1 to DLd.

Although the data driver 300 may be formed separately from the controller 400 and then provided in the film 700, the data driver 300 may be formed in a single body with the controller 400 and then provided in the film 700, the pad area A3 or the main board 800.

Fourthly, the power supply unit 500 supplies various power sources required for the light emitting display apparatus as well as the first driving voltage VDD, the second driving voltage VSS and the initialization voltage Vinit.

Particularly, the power supply unit 500 may modify at least one voltage level of the first driving voltage VDD, the second driving voltage VSS, the initialization voltage Vinit and various power sources under the control of the controller 400.

Fifthly, the controller 400 generates a gate control signal GCS for controlling driving of the gate driver 200, a data control signal DCS for controlling driving of the data driver 300 and a power control signal PCS for controlling driving of the power supply unit 500 based on a timing synchronization signal input from an external system.

Also, the controller 400 converts input image data Ri, Gi and Bi received from the external system to image data Data and transmits the image data Data to the data driver 300.

Particularly, the controller 400 may calculate a resistance value of the power line 150 in the boundary area A1 by using a first sensing signal Sdata1 received from the first sensing line 610 through the first sensing line pad APD1.

The controller 400 may control the power supply unit 500 by using the power control signal PCS such that a size, for example, a level of the power source supplied through the power line 150 may be changed in accordance with the calculated resistance value.

Also, if the second sensing line pad APD2 to which the second sensing line 620 connected with the power line 150 in the pad area A3 is connected is further provided in the pad area A3, the controller 400 may calculate a resistance value of the power line 150 in the boundary area A3 by using the first sensing signal Sdata1 received through the first sensing line pad APD1 and the second sensing signal Sdata2 received through the second sensing line pad APD2.

The controller 400 controls the power supply unit 500 by using the power control signal PCS such that a size, for example, a level of the power source supplied through the power line 150 may be changed in accordance with the calculated resistance value.

To perform the aforementioned function, the controller 400, as shown in FIG. 4, includes a data alignment unit 430 for realigning the input image data Ri, Gi and Bi transmitted from the external system by using the timing synchronization signal TSS transmitted from the external system and supplying the realigned image data Data to the data driver 300, a control signal generator 420 for generating the gate control signal GCS, the data control signal DCS and the power control signal PCS by using the timing synchronization signal TSS, an output unit 440 for outputting the image data Data generated from the data alignment unit 430 and the control signals DCS, GCS and PCS generated from the control signal generator 420 to the data driver 300, the gate driver 200 or the power supply unit 500, and a calculation unit 410 for transmitting the timing synchronization signal TSS and the input image data Ri, Gi and Bi transmitted from the external system to the control signal generator 420 and the data alignment unit 430.

Particularly, the calculation unit 410 calculates a resistance value of the power line 150 in the boundary area A3 by using at least one of the first sensing signal Sdata1 and the second sensing signal Sdata2.

The calculation unit 410 may set the amount of change of the power source to be supplied through the power line 150 in accordance with the above resistance value.

The calculation unit 410 controls the control signal generator 420 to generate the power control signal PCS for outputting a power source having a size or level corresponding to the change set as above.

The process of calculating the resistance value, setting the amount of change and controlling the control signal generator 420 through the calculation unit 410 may be performed through various analysis methods and control algorithms, which are currently used.

For example, the first sensing signal Sdata1 may correspond to the resistance value of the power line 150 from the power supply unit 500 to the boundary area A3.

In this case, the case that the resistance value is great means that the voltage supplied through the power line 150 provided in the boundary area A3 may be lower than the voltage output from the power supply unit 500. Also, if the resistance value can be identified, the voltage of the power line 150 provided in the boundary area A3 can be calculated.

If the voltage of the power line 150 provided in the boundary area A3 is calculated, a difference between a voltage to be ideally supplied to the pixel driving circuit PDC and a voltage substantially supplied may be calculated.

Therefore, the calculation unit 410 may calculate the amount of change by using the above information, and may control the control signal generator 420 such that the power control signal PCS may be generated by the power supply unit 500 to output the power source corresponding to the amount of change.

In the above description, the operations of receiving the first sensing signal Sdata1, calculating the resistance value, calculating the amount of change, and controlling the control signal generator 420 is performed by the calculation unit 410 included in the controller 400.

However, the above operations, that is, the operations of receiving the first sensing signal Sdata1, calculating the resistance value, calculating the amount of change, and controlling the control signal generator 420 may be performed by a separate determination unit provided separately from the controller 400. Also, some of the above operations may be performed by the calculation unit 410 of the controller 400, the others of the above operations may be performed by the separate determination unit provided separately from the controller 400.

Hereinafter, for convenience of description, the light emitting display apparatus of which calculation unit 410 provided in the controller 400 performs all of the above operations will be described as an aspect of the present disclosure.

Also, the controller 400 may further include a storage unit 450 for storing information required to calculate the resistance value and the amount of change.

However, the storage unit 450, as shown in FIG. 4, may be provided separately from the controller 400 and then mounted in the circuit board.

Figure 5:
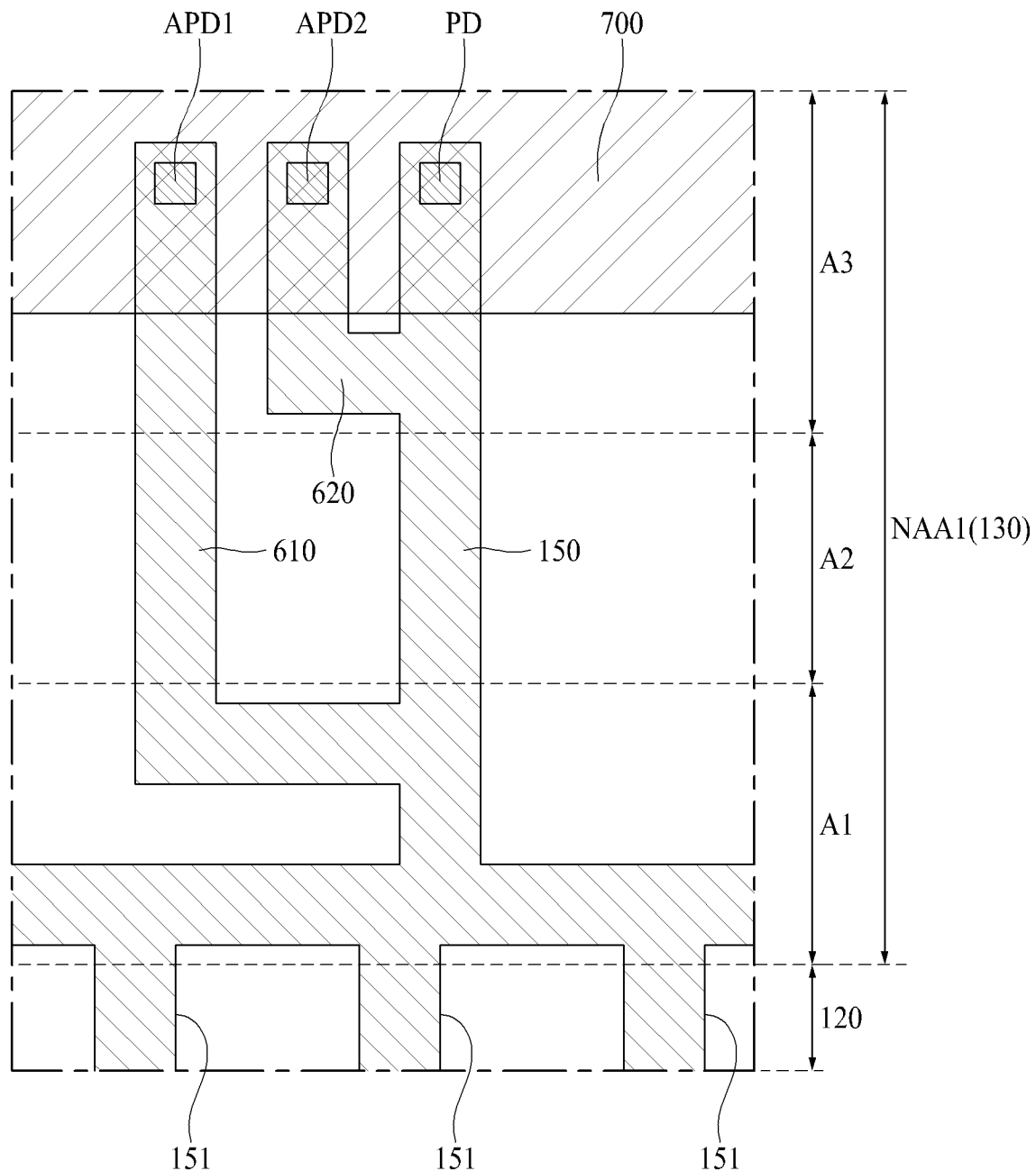
FIG. 5 is an exemplary view illustrating that an area K shown in FIG. 1 is enlarged.
Figure 6:
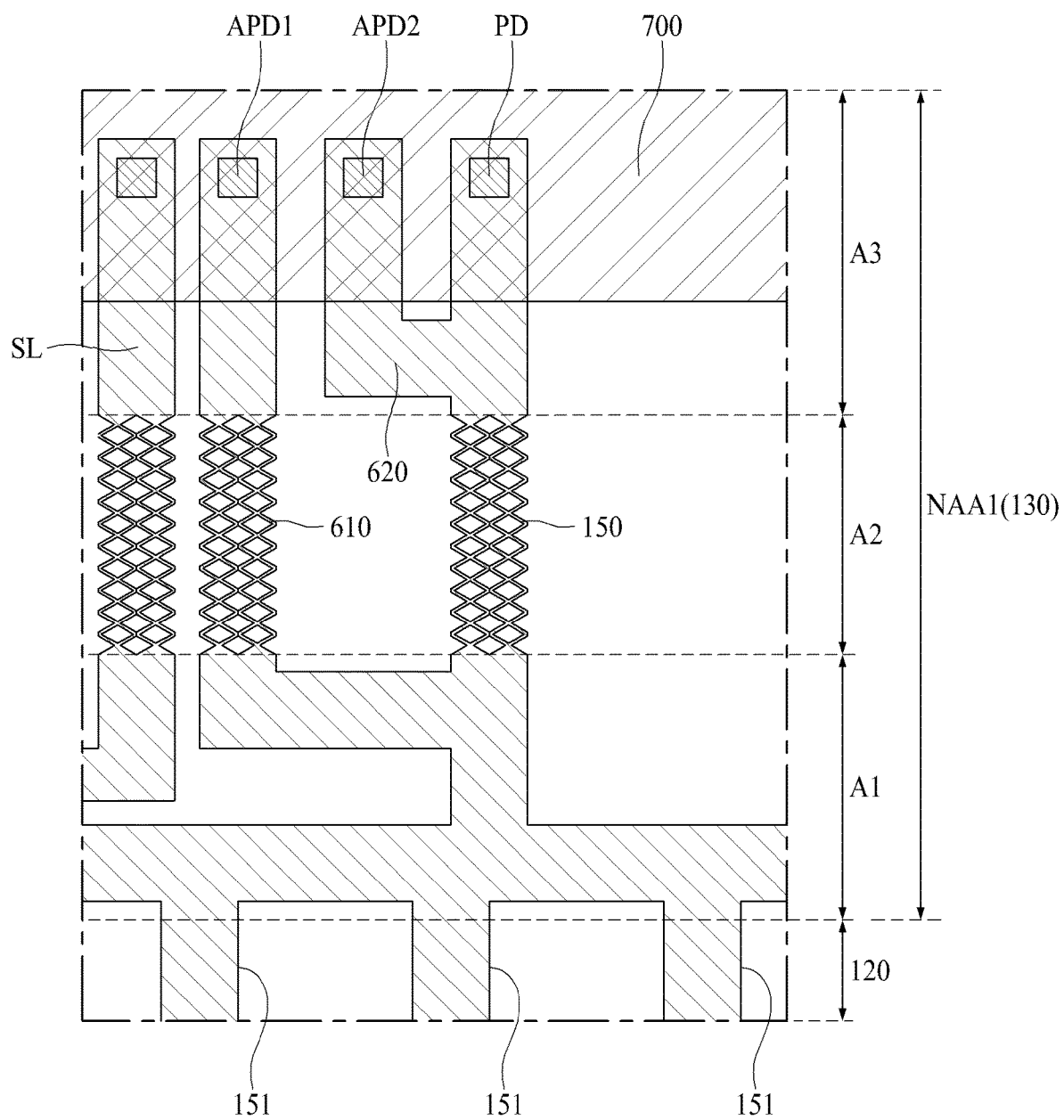
FIG. 6 is another exemplary view illustrating that an area K shown in FIG. 1 is enlarged.

FIG. 5 is an exemplary view illustrating that an area K shown in FIG. 1 is enlarged, and FIG. 6 is another exemplary view illustrating that an area K shown in FIG. 1 is enlarged. Hereinafter, details the same as or similar to the aforementioned description will be omitted or briefly described.

As described above, the light emitting display panel 100 is categorized into a display area 120 provided with pixels 110, displaying an image, and a non-display area 130 surrounding the display area 120, and includes a flexible substrate 111. In FIGS. 5 and 6, a reference numeral NAA1 denotes a first non-display area of the non-display area 130.

In this case, the circuit board is connected to the non-display area 130. The circuit board commonly refers to the main board 800 and the film 700. Therefore, the circuit board may be the main board 800 or the film 700.

As described above, the non-display area 130 includes the first non-display area NAA1, and the first non-display area NAA1 includes a pad area A3 provided with pads electrically connected with the circuit board, a boundary area A1 adjacent to the display area 120, and a bending area A2 provided and bent between the pad area A3 and the boundary area A1.

The pad area A3 is provided with pads for connecting the data driver 300 provided in the film 700 and the controller 400 and the power supply unit 500 provided in the main board 800 with various lines provided in the light emitting display panel 100. The data driver 300 may be packaged in the first non-display area NAA1 not the film 700.

That is, although the pad area A3 provided with the pads, especially the power line pad PD connected with the power line 150, the first sensing line pad APD1 connected with the first sensing line 610 and the second sensing line pad APD2 connected with the second sensing line 620 is shown in FIGS. 1 and 2, as described above, the pad area A3 may further be provided with another pads, that is, pads connected with the data driver 300, pads connected with the controller 400 and pads connected with the power supply unit 500, in addition to the power line pad PD, the first sensing line pad APD1 and the second sensing line pad APD2.

The display area 120 is provided with display area power lines 151 diverged from the power line 150 along the data lines DL1 to DLd, which are provided in the light emitting display panel 100, in the boundary area A1, and the display area power lines 151 are connected to the pixel driving circuit PDC provided in the pixel 110.

As described above, if the power line 150 is a line for supplying the first driving voltage VDD, the display area power line 151 becomes the first driving voltage line PLA, and if the power line 150 is a line for supplying the second driving voltage VSS, the display area power line 151 becomes the second driving voltages line PLB. Also, if the power line 150 is a line for supplying the initialization voltage Vinit, the display area power line 151 becomes the initialization lines SL. Also, the power line 150 may be a line for supplying another voltage in addition to the above voltages.

In this case, the power line 150 in the boundary area A1, as shown in FIGS. 1 and 5, may be extended in a horizontal direction perpendicular to the data lines DL1 to DLd, for example, in a direction parallel with the gate lines GL1 to GLg.

The display area power lines 151 may be diverged from an area extended along the gate lines GL1 to GLg of the power line 150 and the extended in the direction of the display area 120.

If the power line 150 is a line for supplying the first driving voltage VDD, the pixel driving circuit PDC shown in FIG. 3 may include the driving transistor Tdr having a first terminal connected to the display area power line 151, a second terminal connected to the light emitting diode ED and a gate connected to the gate driver 200, and supplying the first driving voltage VDD supplied through the display area power line 151 to the light emitting diode ED.

In this case, the display area power line 151 is the first driving voltage line PLA.

Also, if the power line 150 is a line for supplying the initialization voltage Vinit, the pixel driving circuit PDC shown in FIG. 3 may include the driving transistor Tdr having a first terminal connected to the first driving voltage line PLA, a second terminal connected to the light emitting diode ED and a gate connected to the gate driver 200, and the initialization transistor Tsw2 having a first terminal connected to the display area power line 151, a second terminal connected to the driving transistor Tdr and a gate connected to the gate driver 200 and supplying the initialization voltage Vinit supplied through the display area power line 151 to the driving transistor Tdr.

In this case, the display area power line 151 is the initialization line SL.

The initialization voltage Vinit may serve to initialize at least one of the gate, the first terminal and the second terminal of the driving transistor, and may also serve to initialize the light emitting diode ED. Also, the initialization voltage Vinit may be used to sense a threshold voltage or mobility of the driving transistor Tdr.

To this end, the initialization line SL and the initialization transistor Tsw2 may be provided in the pixel driving circuit PDC in various structures in addition to the structure shown in FIG. 2.

The pad area A3 may be provided with the power line pad PD and the first sensing line pad APD1. The power line pad PD is connected with the power line 150 for supplying power sources to the pixels 110. The first sensing line pad APD1 is connected with the first sensing line 610 extended from the pad area A3 to the boundary area A1 through the bending area A2. The first sensing line 610 is connected with the power line 150 in the boundary area A1. The first sensing line 610 may be connected to the first sensing line pad APD1 by being diverged and extended from the power line 150 of the boundary area A1.

Also, unlike FIG. 5, the first sensing line 610 may be connected with the power line 150 through a contact hole in the boundary area A1. The first sensing line 610 may include a structure in which it is jumped to metal of another layer.

Also, although the first sensing line 610 and the second sensing line 620 may be formed in the bending area A2 in a straight line as shown in FIG. 5, they may have a trace structure to facilitate bending as shown in FIG. 6. At this time, the first sensing line 610 in the bending area A2 and the first sensing line 610 in the boundary area A1 may be formed on their respective layers different from each other or may include their respective metal materials different from each other. The power line 150 connected with the first sensing line 610 as shown in FIG. 5 may be provided in such a manner that two or more may exist in the pad area A3.

In this case, one power line 150 may be a line for supplying the first driving voltage VDD, another one power line 150 may be a line for supplying the second driving voltage VSS, and other one power line 150 may be a line for supplying the initialization voltage Vinit. For example, the initialization line SL is shown in FIG. 6 as the power line for supplying another voltage. In this case, the initialization lien SL shown in FIG. 6 may be formed in the same type as the power line 150 shown in FIG. 6. Also, the initialization line SL may be connected with another first sensing line corresponding to the first sensing line 610 and another sensing line corresponding to the second sensing line 620.

As shown in FIG. 6, if the plurality of power lines 150 are provided, the first sensing line 610 and the second sensing line 620 may be provided between the two power lines 150. However, the present disclosure is not limited to this example.

Also, the pad area A3 may further be provided with the power line 150 for supplying another voltage to the light emitting display panel 100, in addition to the first driving voltage VDD, the second driving voltage VSS and the initialization voltage Vinit.

The pad area A3 may further be provided with a second sensing line pad APD2 to which the second sensing line 620 connected with the power line 150 in the pad area A3 is connected.

The first sensing line 610, as shown in FIG. 5, is connected with the power line 150 below the bending area A2, that is, in the boundary area A1, and the second sensing line 620 is connected with the power line 150 on the top of the bending area A2, that is, in the pad area A3.

A voltage of a power source transmitted to the boundary area A1 by passing through the bending area A2 through the power line 150 or a resistance of the power line 150 in the boundary area A1 may be calculated by the first sensing signal Sdata1 transmitted from the first sensing line 610. A voltage of a power source transmitted to the pad area A3 through the power line 150 or a resistance of the power line 150 in the pad area A3 may be calculated by the second sensing signal Sdata2 transmitted from the second sensing line 620.

In this case, a size of a power source to be actually output by the power supply unit 500, for example, a level of the power source may be determined even by the voltage or resistance calculated by the first sensing signal Sdata1. However, if information extracted by the second sensing signal Sdata2 is used, the size of the power source to be actually output by the power supply unit 500 may be determined more accurately.

For example, according to the first sensing signal Sdata1 and the second sensing signal Sdata2, a characteristic of the bending area A2, that is, resistance characteristic of the bending area A2 or a decrease level of the power source in the bending area A2 may be determined.

Therefore, the calculation unit 410 may control the power supply unit 500 by using the first sensing signal Sdata1 only, or may control the power supply unit 500 by using both of the first sensing signal Sdata1 and the second sensing signal Sdata2.

In order that the above operation may be performed, the controller 40 for controlling the signals supplied to the data lines DL1 to DLd and the gate lines GL1 to GLg provided in the light emitting display panel 100 and the power supply unit 500 connected with the power line 150 are provided in the circuit board. Particularly, the controller 400 is electrically connected with the first sensing line pad APD1.

In this case, the circuit board may be the main board 800 shown in FIG. 1 but may be directly connected to the pad area A3.

Hereinafter, a method for operating the light emitting display apparatus having the aforementioned structure will be described. In the following description, details the same as or similar to the aforementioned description will be omitted or simply described.

If the light emitting display apparatus is turned on, the controller 400 drives the gate driver 200 and the data driver 300, whereby an image is output from the light emitting display panel 100.

In this case, the power supply unit 500 supplies the first driving voltage VDD, the second driving voltage VSS, the initialization voltage Vinit and the other voltages of various levels to the pixel driving circuit PDC through the power line 150.

The display area power line 151 connected with the power line 150 from which the first driving voltage VDD is supplied is the first driving voltage line PLA, the display area power line 151 connected with the power line 150 to which the second driving voltage VSS is supplied is the second driving voltage line PLB, and the display area power line 151 connected with the power line 150 to which the initialization voltage Vinit is supplied is the initialization line SL.

In this case, if the light emitting display panel 100 is provided in the flexible substrate 111 and bent through the bending area A2 as shown in FIG. 2, the first driving voltage VDD, the second driving voltage VSS, the initialization voltage Vinit and the other voltages, which are output from the power supply unit 500, may be different from the first driving voltage VDD, the second driving voltage VSS, the initialization voltage Vinit and the other voltages, which are actually supplied to the pixel driving circuit PDC, due to load and resistance in the bending area A2. Particularly, the actual voltages measured in the pixel driving circuit PDC may be lower than the voltages output from the power supply unit 500.

The voltages output from the power supply unit 500 are set at a level required for the pixel driving circuit PDC. Therefore, if the voltages measured in the pixel driving circuit PDC become lower than the voltages output from the power supply unit 500, the pixel driving circuit PDCH may not be driven normally.

For example, if the first driving voltage VDD output from the power supply unit 500 is set at a level required for the pixel driving circuit PDC, and if the first driving voltage VDD supplied to the pixel driving circuit PDC becomes lower than the voltage output from the power supply unit 500, the light emitting diode ED may not output light of normal brightness.

In this case, luminance deviation may occur in the light emitting display panel 100, whereby picture quality of the light emitting display apparatus may be deteriorated.

Also, if the initialization voltage Vinit output from the power supply unit 500 is set at a level required for the pixel driving circuit PDC, and if the initialization voltage Vinit supplied to the pixel driving circuit PDC becomes lower than the voltage output from the power supply unit 500, the driving transistor Tdr may not be initialized normally.

In this case, normal compensation for a change of the threshold voltage of the driving transistor Tdr may not be performed.

If the change of the threshold voltage of the driving transistor Tdr is not compensated normally, the light emitting diode ED fails to output light having normal brightness corresponding to the data voltage. In this case, luminance deviation may occur in the light emitting display panel 100, whereby picture quality of the light emitting display apparatus may be deteriorated.

To avoid this, in the present disclosure, the power supply unit 500 is controlled using information collected by the calculation unit 410 through the first sensing signal Sdata1. Therefore, the power supply unit 500 may upgrade the level of the voltage output therefrom such that the voltage required for the pixel driving circuit PDC may substantially be supplied to the pixel driving circuit PDC.

To this end, the controller 400 may control the power supply unit 500 by using the first sensing signal Sdata1 at various timings.

If the level of the voltages output through the power supply unit 500 is changed while the light emitting display apparatus is being driven, the image output from the light emitting display panel 100 may suddenly be changed.

Therefore, the operation of the controller 400 for controlling the power supply unit 500 by using the first sensing signal Sdata1 may be performed when an electronic device (for example, television (TV), monitor, smartphone, tablet PC, etc.) included in the light emitting display apparatus is turned off or turned on.

For example, a device-off signal for cutting off the power source supplied to the light emitting display panel 100 is received from the external system for controlling driving of the electronic device, the controller 400, especially the calculation unit 410 calculates the resistance value by using either the first sensing signal Sdata1 or the first sensing signal Sdata1 and the second sensing signal Sdata2.

The device-off signal may be transmitted from the external system to the controller 400 if a user turns off a power switch of the electronic device.

The controller 400 sets the amount of change of the power source to be supplied through the power line 150 in accordance with the resistance value.

The resistance value and the amount of change may be stored in the storage unit 450.

Also, when the device-off signal is received, the controller 400 may store the first sensing signal Sdata1 and the second sensing signal Sdata2 in the storage unit 450, and the process of calculating the resistance value and the process of calculating the amount of change may be performed when the electronic device is turned off and then turned on.

After the device-off signal is received, if a device-on signal is received from the external system, the controller 400 generates a control signal for allowing the power supply unit 500 to output the power source corresponding to the amount of change and transmits the generated control signal to the power supply unit 500.

Therefore, the power supply unit 500 may upgrade the level of the voltage output therefrom such that the voltage required for the pixel driving circuit PDC may substantially be supplied to the pixel driving circuit PDC.

The device-on signal may be transmitted from the external system to the controller 400 if a user turns on the power switch of the electronic device.

However, the aforementioned processes may be performed before the device-off signal is received, that is, while the light emitting display apparatus is being driven to output an image.

According to the present disclosure described as above, the power supply unit 500 may upgrade the level of the voltage output therefrom such that the voltage required for the pixel driving circuits PDC may substantially be supplied to the pixel driving circuits PDC.

Therefore, the pixel driving circuit PDC may normally be driven, and thus quality of the light emitting display apparatus may be improved.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display apparatus comprising:
   a light emitting display panel including a display area displaying an image and a non-display area surrounding the display area;
   a first non-display area of the non-display area including a pad area provided with pads electrically connected with a circuit board, a boundary area adjacent to the display area, and a bending area provided between the pad area and the boundary area,
   a power line pad and a first sensing line pad provided in the pad area;
   wherein the power line pad supplies a power source to pixels of the display area and is connected with a power line provided in the pad area, the bending area and the boundary area, and
   wherein the first sensing line pad is connected with a first sensing line provided in the pad area, the bending area and the boundary area, and the first sensing line is connected with the power line in the boundary area.

2. The light emitting display apparatus of claim 1, wherein the display area is provided with display area power lines diverged from the power line in the boundary area, and each of the display area power lines is connected to a pixel driving circuit provided in each of the pixels.

3. The light emitting display apparatus of claim 2, wherein the pixel driving circuit includes:
   a light emitting diode;
   a driving transistor having a first terminal connected to the display area power line, a second terminal connected to the light emitting diode, and a gate connected to a gate driver, and
   a first driving voltage supplied through the display area power line is supplied to the light emitting diode through the driving transistor.

4. The light emitting display apparatus of claim 1, wherein the power line is a line for supplying an initialization voltage to the pixels of the display area.

5. The light emitting display apparatus of claim 1, wherein the pad area is provided with another power line pad and another first sensing line pad, the another power line pad supplies another power source to the pixels, and is connected with another power line provided in the pad area, the bending area and the boundary area, and the another first sensing line pad is connected with another first sensing line provided in the pad area, the bending area and the boundary area in the boundary area.

6. The light emitting display apparatus of claim 5, wherein the first sensing line pad is provided between the power line pad and the another power line pad.

7. The light emitting display apparatus of claim 1, wherein the pad area is further provided with a second sensing line pad, the second sensing line pad is connected with a second sensing line, and the second sensing line is connected with the power line in the pad area.

8. The light emitting display apparatus of claim 1, wherein the power source is a first driving voltage for driving a light emitting diode provided in each of the pixels, a second driving voltage for driving the light emitting diode, or an initialization voltage for initializing a driving transistor provided in each of the pixels.

9. The light emitting display apparatus of claim 1, wherein the bending area is bent in a direction of a rear surface of the light emitting display panel.

10. The light emitting display apparatus of claim 2, wherein the display area power lines are provided along data lines provided in the light emitting display panel.

11. A light emitting display apparatus comprising:
a light emitting display panel including a display area provided with pixels, displaying an image, and a non-display area surrounding the display area; and
a controller for controlling signals to data lines and gate lines provided in the light emitting display panel,
wherein the non-display area includes a pad area provided with pads, a boundary area adjacent to the display area and a bending area provided between the pad area and the boundary area,
the pad area is provided with a power line pad and a first sensing line pad,
the power line pad supplies a power source to the pixels, and is connected with a power line provided in the pad area, the bending area and the boundary area,
the first sensing line pad is connected with a first sensing line provided in the pad area, the bending area and the boundary area,
the first sensing line is connected with the power line in the boundary area, and
the controller is electrically connected with the first sensing line pad.

12. The light emitting display apparatus of claim 11, wherein the controller calculates a resistance value of the power line in the boundary area by using a first sensing signal received through the first sensing line pad, and changes a size of a power source supplied through the power line in accordance with the calculated resistance value.

13. The light emitting display apparatus of claim 12, wherein the controller calculates the resistance value by using the first sensing signal and sets an amount of change of the power source to be supplied through the power line in accordance with the resistance value if a device-off signal for cutting off the power source supplied to the light emitting display panel is received from an external system, and generates a control signal for outputting the power source corresponding to the amount of change if a device-on signal is received from the external system after the device-off signal is received.

14. The light emitting display apparatus of claim 11, wherein the pad area is further provided with a second sensing line pad, the second sensing line pad is connected with a second sensing line, and the second sensing line is connected with the power line in the pad area.

15. The light emitting display apparatus of claim 14, wherein the controller is electrically connected with the first sensing line pad and the second sensing line pad.

16. The light emitting display apparatus of claim 15, wherein the controller calculates a resistance value of the power line in the boundary area by using a first sensing signal received through the first sensing line pad and a second sensing signal received through the second sensing line pad, and changes a size of a power source supplied through the power line in accordance with the calculated resistance value.

17. A light emitting display apparatus including a display area and a non-display area, comprising:
a flexible substrate including a boundary area, a pad area and a bending area in the non-display area, the pad area extended from the boundary area and the bending area adjacent to the display area and connecting the boundary area with the pad area;
an encapsulating substrate sealing the flexible substrate;
a power line pad disposed in the pad area and supplying a power source to pixels in the display area and connected with a power line disposed in the pad area;
a first sensing line pad disposed in the pad area and connected with a first sensing line that is connected with the power line in the boundary area;
a second sensing line pad connected with a second sensing line that is connected with the power line in the pad area; and
a controller for controlling signals to data lines and gate lines and electrically connected with the first sensing line pad and the second sensing line pad.

18. The light emitting display apparatus of claim 17, wherein the controller calculates a resistance value of the power line in the boundary area by using a first sensing signal received through the first sensing line pad, and changes an amount of a power source supplied through the power line in accordance with the calculated resistance value.

19. The light emitting display apparatus of claim 18, wherein the controller calculates the resistance value of the power line in the boundary area when a device-off signal for cutting off the power source supplied to the light emitting display apparatus is received from an external system, and
wherein the controller generates a control signal for outputting the power source corresponding to the amount of change when a device-on signal is received from the external system after the device-off signal is received.

20. The light emitting display apparatus of claim 17, wherein the controller calculates a resistance value of the power line in the boundary area by using a first sensing signal received through the first sensing line pad and a second sensing signal received through the second sensing line pad, and changes a size of a power source supplied through the power line in accordance with the calculated resistance value.

* * * * *